United States Patent
Tsai et al.

(10) Patent No.: US 6,514,817 B1
(45) Date of Patent: Feb. 4, 2003

(54) METHOD OF FORMING SHALLOW TRENCH

(75) Inventors: Nien-Yu Tsai, Hsinchu (TW); Yung-Ching Wang, Hsinchu (TW)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 10/116,881

(22) Filed: Apr. 5, 2002

(30) Foreign Application Priority Data

Sep. 25, 2001 (TW) ........................................ 090123650

(51) Int. Cl.[7] .......................................... H02L 21/8242
(52) U.S. Cl. ........................................ 438/248; 438/391
(58) Field of Search ................................ 438/243, 248, 438/391, 737; 257/296, 301, 305

(56) References Cited

U.S. PATENT DOCUMENTS

| | | | | |
|---|---|---|---|---|
| 5,358,891 A | * | 10/1994 | Tsang et al. | 438/243 |
| 6,037,210 A | * | 3/2000 | Leas | 438/425 |
| 6,074,909 A | * | 6/2000 | Guening | 438/242 |
| 6,140,673 A | * | 10/2000 | Kohyama | 257/301 |
| 6,172,390 B1 | * | 1/2001 | Rupp et al. | 257/302 |
| 6,255,683 B1 | * | 7/2001 | Radens et al. | 257/301 |
| 6,391,706 B2 | * | 5/2002 | Wu et al. | 438/243 |
| 6,451,648 B1 | * | 9/2002 | Gruening et al. | 438/243 |

FOREIGN PATENT DOCUMENTS

| | | | | |
|---|---|---|---|---|
| DE | 019903597 A1 | * | 10/2000 | H01L/21/762 |
| EP | 000969514 A2 | * | 5/2000 | H01L/27/108 |

* cited by examiner

*Primary Examiner*—Olik Chaudhuri
*Assistant Examiner*—David S Blum
(74) *Attorney, Agent, or Firm*—Gazdzinski & Associates

(57) ABSTRACT

A method of forming a shallow trench in a specific region located between two adjacent deep trench capacitor constructions on a semiconductor substrate, each the deep trench capacitor construction having a collar construction and a conductor construction is provided. The method of forming a shallow trench includes steps of (a) defining a mask by forming a mask layer on the semiconductor substrate which has the deep trench capacitor constructions, (b) performing a first etching process with respect to the regions, which is not covered by the mask, so as to form a first depth trench, in which the first etching process has a relatively high selectivity ratio of the conductor construction relative to the mask, and (c) performing a second etching process with respect to the first depth trench so as to form a second depth trench, in which the second etching process has a selectivity ratio of the conductor construction relative to the collar construction substantially close to 1.

12 Claims, 6 Drawing Sheets

METHOD OF FORMING SHALLOW TRENCH

FIELD OF THE INVENTION

The present invention is related to a method of forming a shallow trench, and more particularly, to a method of forming a shallow trench in a specific region located between two adjacent deep trench capacitor constructions on a semiconductor substrate.

BACKGROUND OF THE INVENTION

All the while, manufacturers expect to achieve a larger capacitance and a higher element accumulation degree in a limited space of a DRAM cell. Accordingly, the construction of a deep trench capacitor and the construction of a STI (i.e., Shallow Trench Isolation) are simultaneously implemented in the processes of manufacturing a DRAM cell.

Please refer to FIGS. 1(a), 1(b) and 1(c) and FIGS. 2(a), 2(b) and 2(c). They show conventional procedures of etching a shallow trench on a semiconductor substrate 10 which has deep trench capacitors construction 11. Because the depth of the collar structure 112 of the deep trench capacitor construction 11 can not be controlled to keep constant in the manufacturing process, as shown in FIG. 1(a) and FIG. 2(a), the variation of the depth of the collar structure occurs, so that the depth is either too shallow or too deep. For covering the range of the variation of the depth, people use borosilicate glass (BSG) 131, silicon nitride (SiN) 132, and silicon oxide ($SiO_2$) 133 to construct the mask 13 so as to perform an etching process with respect to the polycrystalline silicon 111 and portions of the substrate 10 with a constant depth under a high selectivity ratio (silicon relative to silicon oxide). Accordingly, the shallow trench construction is formed as shown in FIG. 1(b) and FIG. 2(b). They clearly show that the bottom of the shallow trench construction is not flat because the collar structure 112 constituted by the silicon oxide which is remained after the etching process of high selectivity ratio. According to the conventional procedures, we need one more additional etching process of high selectivity ratio (silicon oxide relative to silicon) in order to eliminate the phenomenon that the portion of the collar structure 112 constituted by the silicon oxide is projected from the bottom. However, as shown in FIGS. 1(c), 2(c), they have clearly shown that the bottom of the shallow trench construction is still not flat. Some portions 113 project from the bottom, and some portions 114 are recessed at the bottom. As a result, in the consequent manufacturing process, the occurrence of defect increases such that the yield is affected thereby. Therefore, the present applicant tried to rectify this drawback by this invention.

SUMMARY OF THE INVENTION

It is therefore a primary objective of the present invention to provide a method of forming a shallow trench which can reduce the occurrence of defect and increase the yield rate by means of flattening the bottom of the shallow trench.

According to the present invention, a method of forming a shallow trench in a specific region located between two adjacent deep trench capacitor constructions on a semiconductor substrate is disclosed, each deep trench capacitor construction having a collar construction and a conductor construction. The method of forming a shallow trench comprises steps of (a) defining a mask by forming a mask layer on the semiconductor substrate which has the deep trench capacitor constructions, (b) performing a first etching process with respect to the regions which is not covered by the mask so as to form a first depth trench, wherein the first etching process has a relatively high selectivity ratio of the conductor construction relative to the mask, and (c) performing a second etching process with respect to the first depth trench so as to form a second depth trench, wherein the second etching process has a selectivity ratio of the conductor construction relative to the collar construction substantially close to 1.

Preferably, the semiconductor substrate is a silicon substrate.

Preferably, the collar construction is constructed by silicon oxide.

Preferably, the conductor construction is constructed by polycrystalline silicon.

Preferably, the mask layer includes a silicon oxide layer formed on the semiconductor substrate, a silicon nitride layer formed on the silicon oxide layer, and a doped silicon oxide layer formed on the silicon nitride layer.

Preferably, the doped silicon oxide layer is a borosilicate glass (BSG) layer.

Preferably, the first etching process has a relatively high selectivity ratio of silicon relative to silicon oxide.

Preferably, the reacting gases of the first etching process comprises hydrogen bromide (HBr), chlorine ($Cl_2$), oxygen ($O_2$), and inert gas.

Preferably, wherein the second etching process has a selectivity ratio of the polycrystalline silicon relative to the silicon oxide substantially close to 1.

Preferably, the second etching process is a plasma etching process.

Preferably, the reacting gases of the plasma etching process comprises trifluoromethane ($CHF_3$), tetrafluoromethane ($CF_4$), and chlorine ($Cl_2$).

Preferably, the depth of the bottom of the first depth trench is less then that of the top of the collar construction.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

Please refer to FIGS. 3(a), 3(b), 3(c), and 3(d), and FIGS. 4(a), 4(b), 4(c), and 4(d). They show procedures of etching a shallow trench on a semiconductor substrate 20 which has a deep trench capacitor construction 21 according to preferred embodiments of the present invention.

Figure 1A:
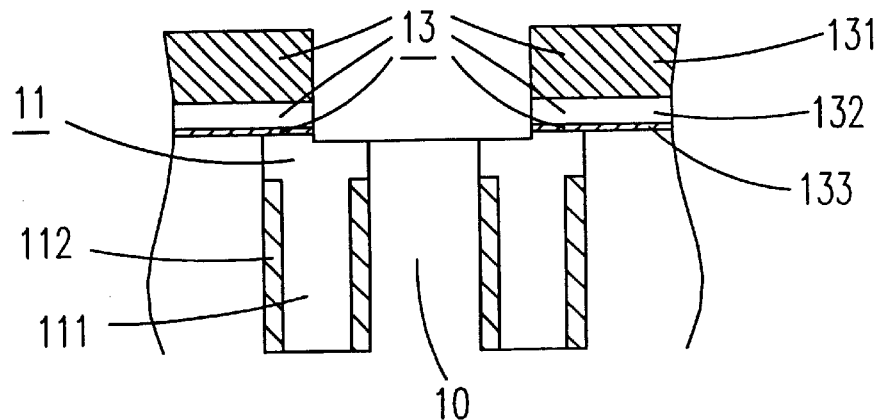
FIGS. 1(a), 1(b), and 1(c) show conventional procedures of etching a shallow trench on a semiconductor substrate which has a deep trench capacitor construction.
Figure 1B:
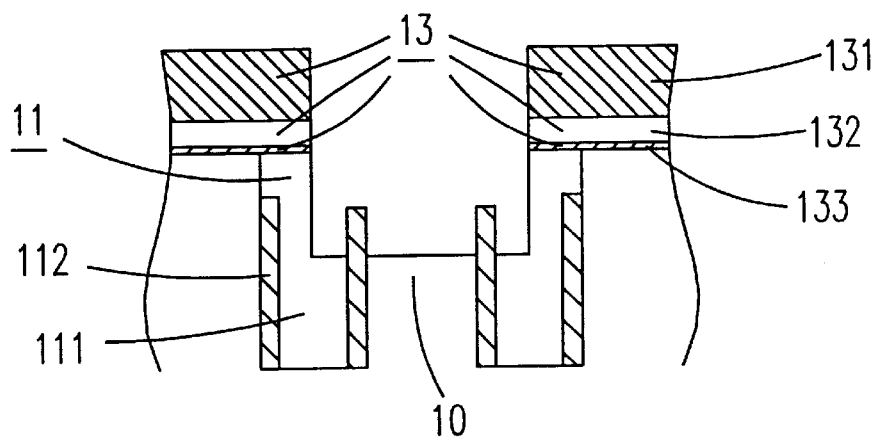
Figure 1C:
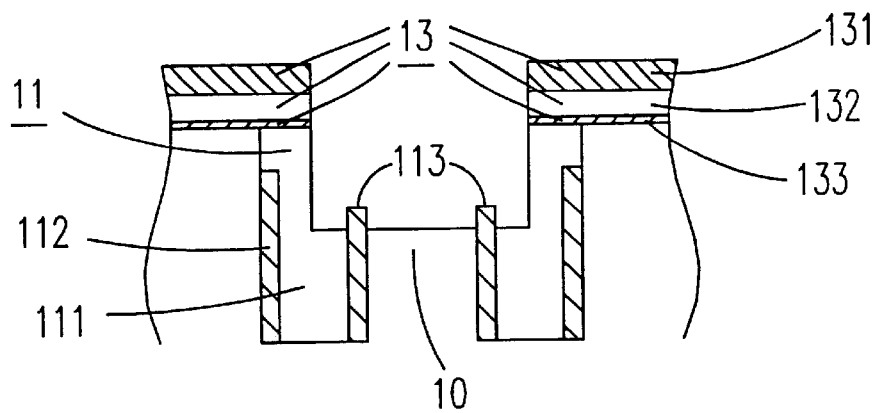
Figure 2A:
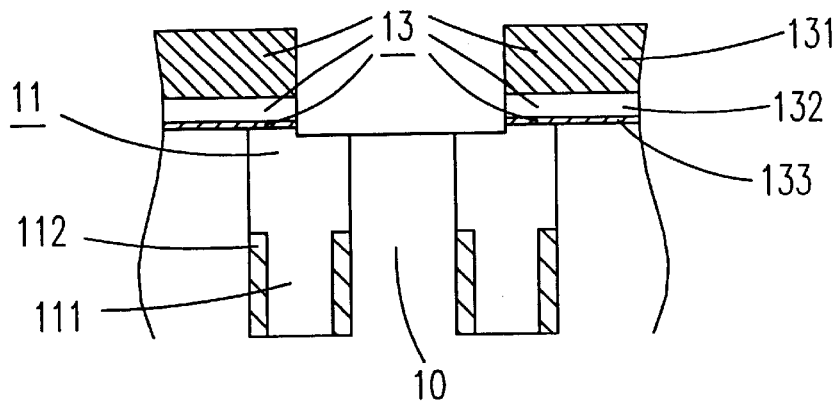
FIGS. 2(a), 2(b), and 2(c) show conventional procedures of etching a shallow trench on a semiconductor substrate which has a deep trench capacitor construction.
Figure 2B:
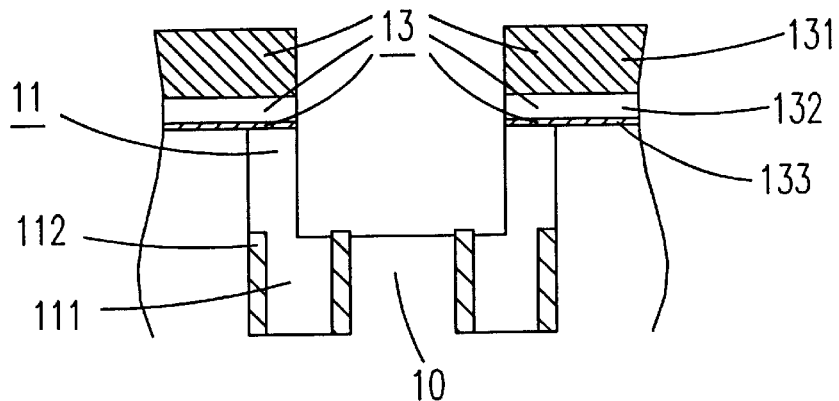
Figure 2C:
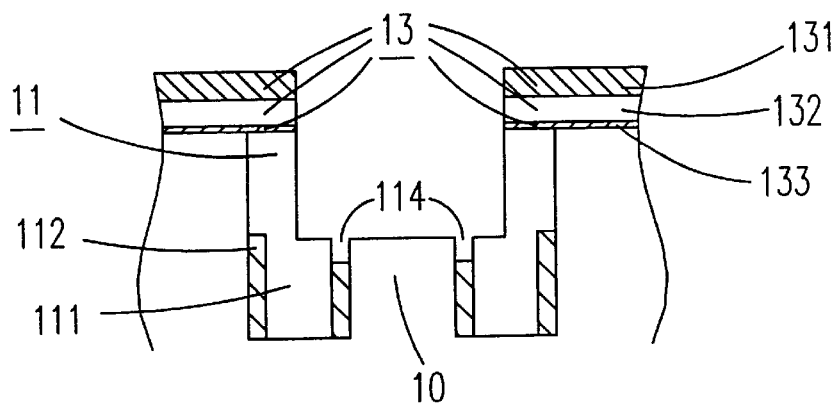
Figure 3A:
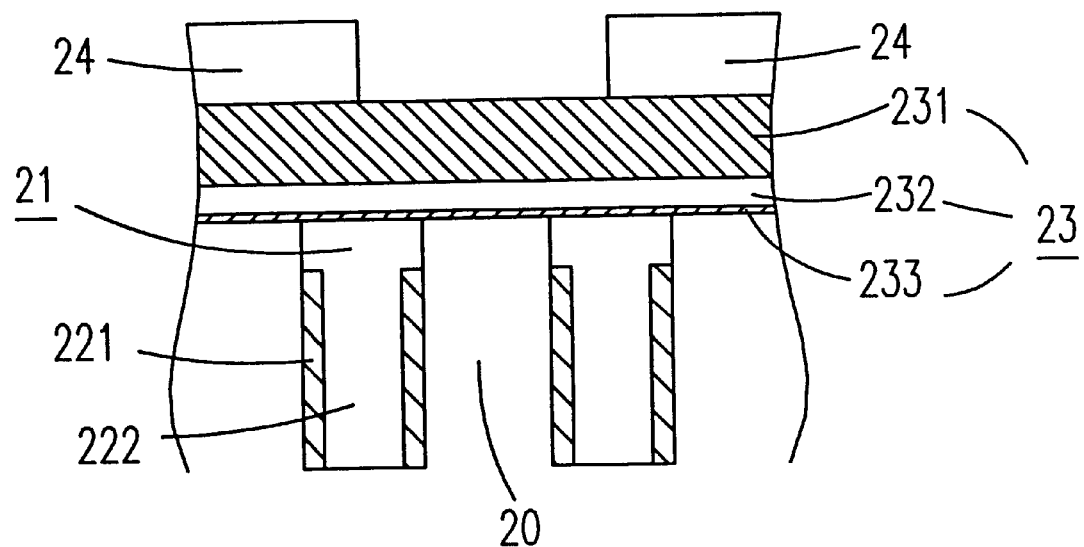
FIGS. 3(a), 3(b), 3(c), and 3(d) show procedures of etching a shallow trench on a semiconductor substrate which has a deep trench capacitor construction according to a preferred embodiment of the present invention.
Figure 3B:
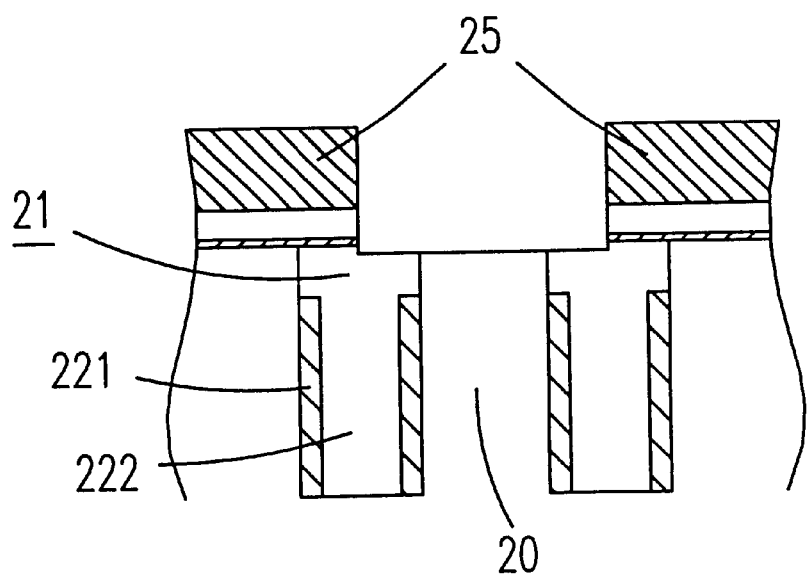
Figure 3C:
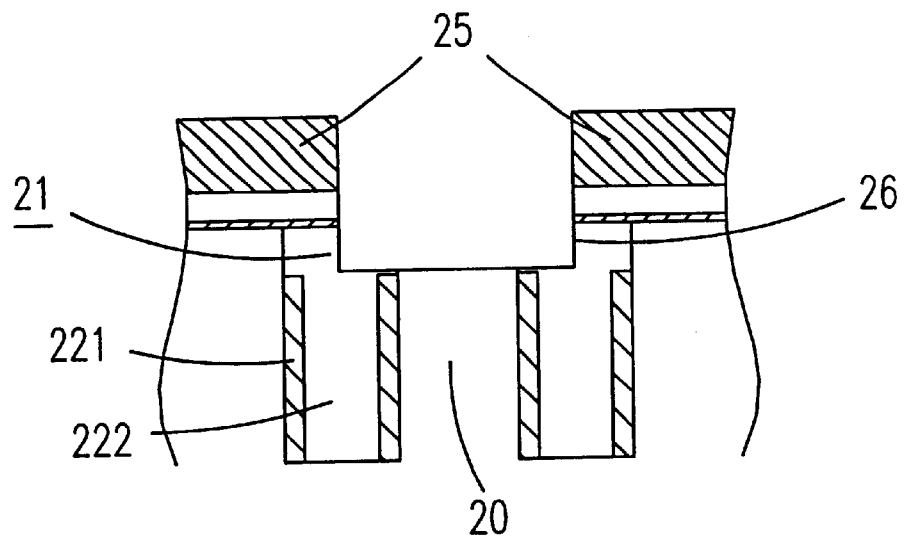
Figure 4A:
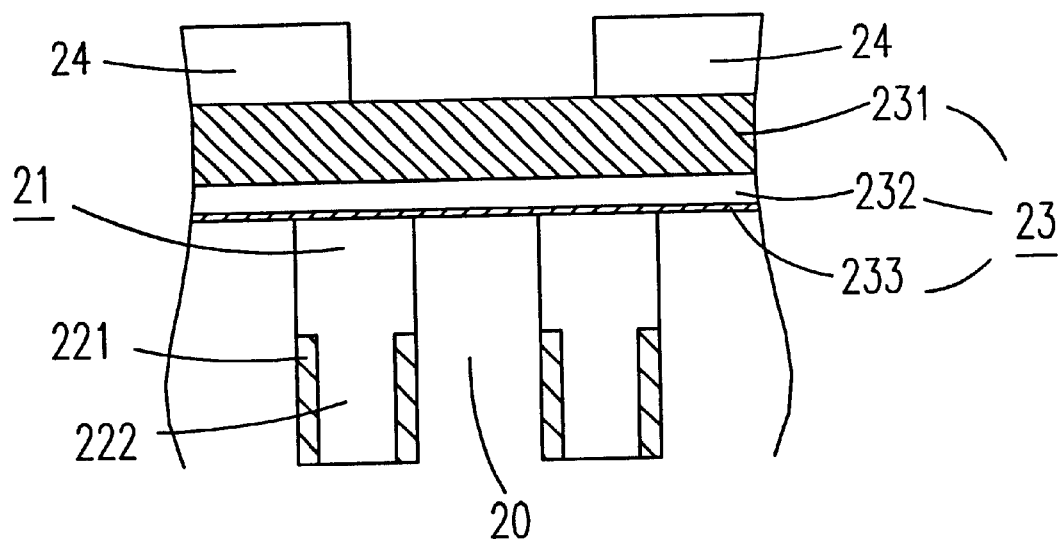
FIGS. 4(a), 4(b), 4(c), and 4(d) show procedures of etching a shallow trench on a semiconductor substrate which has a deep trench capacitor construction according to another preferred embodiment of the present invention.
Figure 4B:
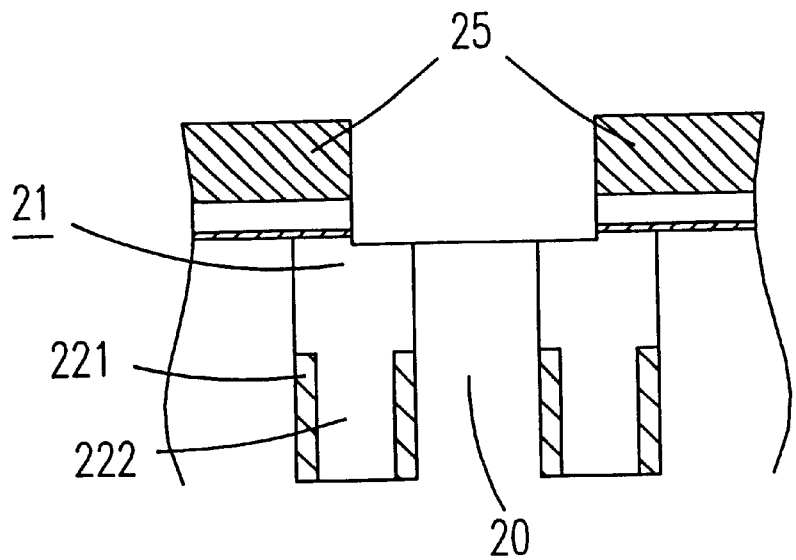
Figure 4C:
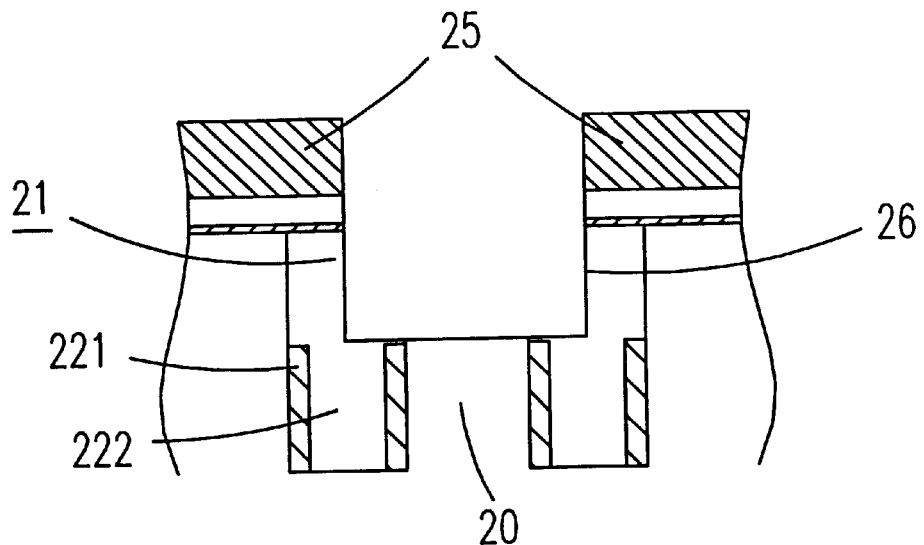

Because the depth of the collar structure 221 of the deep trench capacitor construction can not be controlled to keep constant in the front end manufacturing process. As shown in FIG. 3(a), and FIG. 4(a), the variation of the depth of the collar structure occurs, so that the depth is either too shallow or too deep. First, we use borosilicate glass (BSG) 231, silicon nitride (SiN) 232, and silicon oxide (SiO$_2$) 233 to construct the mask layer 23; next, cooperating with the photoresist (PR) to perform photolithography etching so as to form the mask 25 as shown in FIG. 3(b) and FIG. 4(b); then to perform a first etching process with respect to the regions which are not covered by the mask 25. The first etching process has a relatively high selectivity ratio of the conductor construction 222 relative to the mask 25. Accordingly, a first depth trench 26 is formed as shown in FIG. 3(c), and FIG. 4(c). The depth of the bottom is the STI target depth and is preferred to be controlled less than the depth of the top of the collar structure 221, so that the top of the collar structure 221 will not project from the bottom of the first depth trench 26.

Figure 3D:
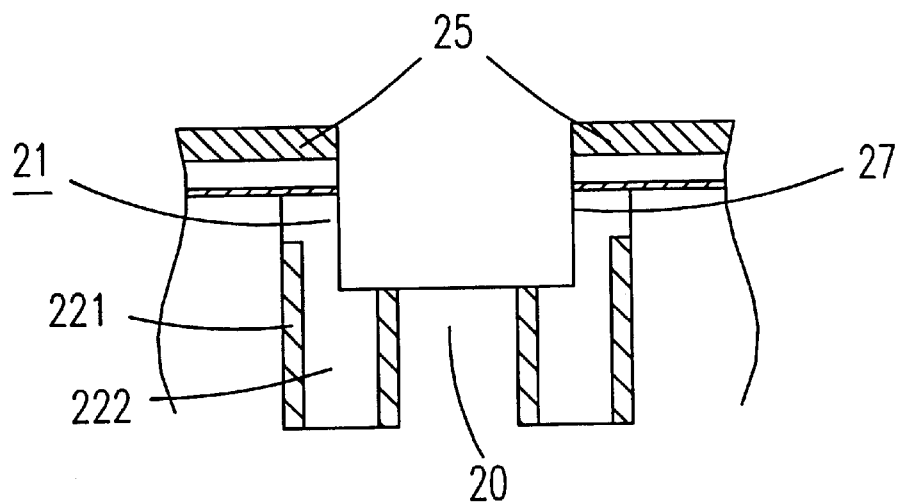
Figure 4D:
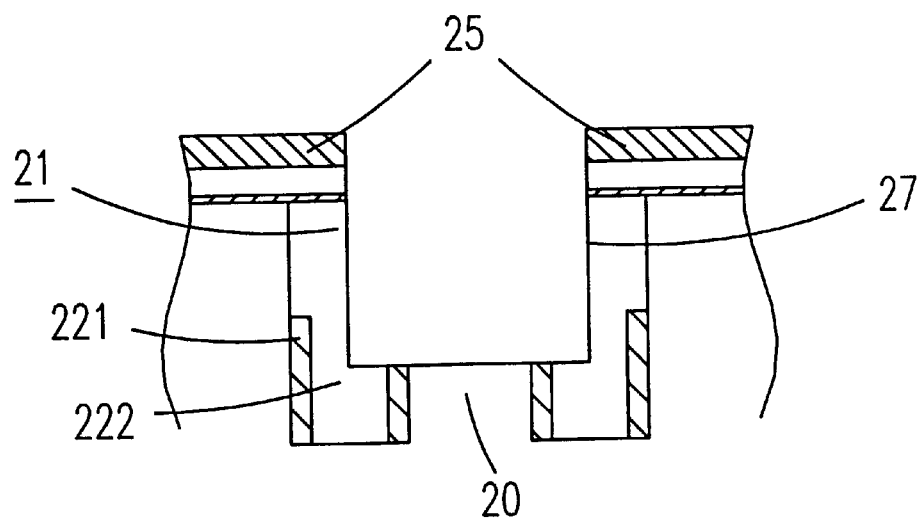

Subsequently, a second etching process is performed with respect to the first depth trench 26 so as to form a second depth trench 27, as shown in FIG. 3(d) and FIG. 4(d). A major characteristic of the present invention is that, in the second etching process, the selectivity ratio of the conductor construction 222 relative to the collar structure 221 is substantially close to 1. Therefore, the etching rates of the collar structure 221 and the conductor construction 222 are about the same, this rendering the bottom of the second depth trench 27 flat. Thus, the drawback of the prior art is overcome. Furthermore, the occurrence of defects is lowered and the yield of mass production is increased.

The semiconductor substrate mentioned above may be a silicon substrate, the collar structure 221 may be a silicon oxide, and the conductor construction may be a polycrystalline silicon. The first etching process is a plasma etching process that has a relatively high selectivity ratio of silicon relative to silicon oxide, and the reacting gases include hydrogen bromide (HBr), chlorine (Cl$_2$), oxygen (O$_2$), and inert gas. The second etching process may also be a plasma etching process, and the reacting gases include trifluoromethane (CHF$_3$), tetrafluoromethane (CF$_4$), and chlorine (Cl$_2$) so as to have a selectivity ratio of silicon oxide relative to polycrystalline silicon about 1:1, since for such ratio, the range between 1:0.9 and 0.9:1 can usually be accepted.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of forming a shallow trench in a specific region located between two adjacent deep trench capacitor constructions on a semiconductor substrate, each said deep trench capacitor construction having a collar construction and a conductor construction, comprising steps of:

(a) defining a mask by forming a mask layer on said semiconductor substrate having said deep trench capacitor constructions;

(b) performing a first etching process with respect to said specific region uncovered by said mask so as to form a first depth trench, said first etching process having a relatively high selectivity ratio of said conductor construction relative to said mask; and (c) performing a second etching process with respect to said first depth trench so as to form a second depth trench, said second etching process having a selectivity ratio of said conductor construction relative to said collar construction substantially close to 1.

2. The method according to claim 1 wherein said semiconductor substrate is a silicon substrate.

3. The method according to claim 1 wherein said collar construction is constructed by silicon oxide.

4. The method according to claim 3 wherein said conductor construction is constructed by polycrystalline silicon.

5. The method according to claim 4 wherein said mask layer comprises:

a silicon oxide layer formed on said semiconductor substrate;

a silicon nitride layer formed on said silicon oxide layer; and a doped silicon oxide layer formed on said silicon nitride layer.

6. The method according to claim 5 wherein said doped silicon oxide layer is a BSG (borosilicate glass) layer.

7. The method according to claim 1 wherein said first etching process has a relatively high selectivity ratio of Silicon relative to silicon oxide.

8. The method according to claim 1 wherein said second etching process has a selectivity ratio of said polycrystalline silicon relative to said silicon oxide substantially close to 1.

9. The method according to claim 8 wherein said second etching process is a plasma etching process.

10. The method according to claim 9 wherein the reacting gas of said plasma etching process comprises trifluoromethane (CHF$_3$), tetrafluoromethane (CF$_4$), and chlorine (Cl$_2$).

11. The method according to claim 8 wherein the depth of the bottom of said first depth trench is the STI target depth and is less then that of the top of said collar construction.

12. The method according to claim 7 wherein the reacting gas of said first etching process comprises hydrogen bromide (HBr), chlorine (Cl$_2$), oxygen (O$_2$), and inert gas.

* * * * *